United States Patent [19]

McGinn

[11] Patent Number: 5,663,690
[45] Date of Patent: Sep. 2, 1997

[54] CONSTANT HIGH Q VOLTAGE CONTROLLED OSCILLATOR

[75] Inventor: Michael McGinn, Tempe, Ariz.

[73] Assignee: Motorola, Inc., Schaumburg, Ill.

[21] Appl. No.: 611,392

[22] Filed: Mar. 6, 1996

[51] Int. Cl.$^6$ .................... H03B 5/08; H03L 5/00
[52] U.S. Cl. .................... 331/109; 331/167; 331/183
[58] Field of Search .................... 331/117 R, 117 FE, 331/167, 109, 182, 183

[56] References Cited

U.S. PATENT DOCUMENTS

| | | | |
|---|---|---|---|
| 3,835,418 | 9/1974 | Gilbert | 331/141 |
| 3,965,441 | 6/1976 | Roy et al. | 331/117 R |
| 4,638,265 | 1/1987 | Lunn et al. | 333/214 |
| 5,117,205 | 5/1992 | Nauta | 331/117 FE |

*Primary Examiner*—Siegfried H. Grimm
*Attorney, Agent, or Firm*—Gary W. Hoshizaki; Robert D. Atkins

[57] ABSTRACT

A method is described for maintaining a constant Q in a voltage controlled oscillator (VCO) which is tuned over a broad frequency band. A tank circuit (111) sets a center frequency of an oscillator circuit (112). A variable reactance circuit (113) provides a variable effective reactance across the tank circuit (111) corresponding to an applied tuning voltage (117) for tuning the VCO. Resistive currents from the variable reactance circuit are rectified by a rectification circuit (120). A comparator produces a Q control voltage corresponding to the rectified resistive currents and a reference current Iref at a terminal (126) which is coupled to a variable resistance circuit (122) for supplying differential resistive currents to the tank circuit (111) which offset the resistive currents from the variable reactance circuit, thereby maintaining a constant Q in the VCO.

26 Claims, 2 Drawing Sheets

CONSTANT HIGH Q VOLTAGE CONTROLLED OSCILLATOR

BACKGROUND OF THE INVENTION

The present invention relates in general to voltage controlled oscillators, and more particularly, to voltage controlled oscillators having a constant high Q over a wide tuning range.

Voltage controlled oscillators (VCOs) operated at the intermediate frequency (IF) of a television receiver are commonly used for synchronously demodulating audio and video information contained in the incoming radio frequency (RF) carrier. Such a VCO must be stable and must have a high Q and low phase noise. If the receiver is intended for worldwide use the VCO must also be tunable over a frequency range because each country has its own IF and demodulation standards. The variation in IF standards in effect around the world ranges from at least 34 megahertz to 56 megahertz. In the United States the standard television IF is 45.75 megahertz.

The IF oscillator requires a narrow bandwidth for good television channel selection and noise immunity. To achieve the narrow bandwidth tank circuits formed with an inductor and a capacitor are generally used because they have an inherently high Q and narrow bandwidth. However, tank circuits resonate at a fixed frequency so that additional circuit components are needed for frequency tuning. One known tuning method uses a tank circuit along with a capacitive device such as a varactor diode for varying the frequency. A control voltage is applied to the varactor diode to change its capacitance, thereby changing the resonant frequency. A disadvantage of using varactor diodes is that a large variation in control voltage is needed for tuning them, making them impractical to integrate on a semiconductor die with the VCO.

Another known tuning method uses a balanced variable reactance circuit to generate reactance currents in the tank circuit in response to a tuning signal. A balanced variable reactance circuit is easily integrated on a semiconductor die but has a disadvantage of introducing error currents into the tank circuit which result in wide variations in Q as the VCO is tuned across a frequency band. The result is nonuniform noise performance of certain television channels. Performance is even less uniform if inexpensive inductors with high series resistance are used in the tank circuit.

There is a need for a VCO in a television receiver which can be tuned over a wide range of IF frequencies and be manufactured at low cost. It would be a benefit if the VCO used a method for tuning which did not require using large control voltages and could be readily integrated on a semiconductor die. It would be a further benefit if a constant Q could be maintained across the tuning range so that the VCO had both low noise and stable operation. It would be even more advantageous if the method compensated for using inexpensive tank inductors having high resistance without lowering performance in the VCO.

DETAILED DESCRIPTION OF THE DRAWINGS

Voltage controlled oscillators (VCOs) are commonly used in television receivers to provide a reference at the intermediate frequency (IF) for demodulating audio and video information contained in the incoming radio frequency (RF) carrier. A television receiver for use worldwide must have a VCO which can accommodate the different IF frequency standards in effect globally. In practice, such a VCO requires a constant, high Q as the VCO is tuned over a range from at least 34 megahertz to 56 megahertz.

A high Q is required so the receiver has a narrow bandwidth in order to achieve good noise immunity. Tank circuits comprised of an inductor and a capacitor are normally used in such oscillators because their inherently high Q results in narrow bandwidth. However, the inherently high Q makes them impractical to tune without additional components.

Figure 1:
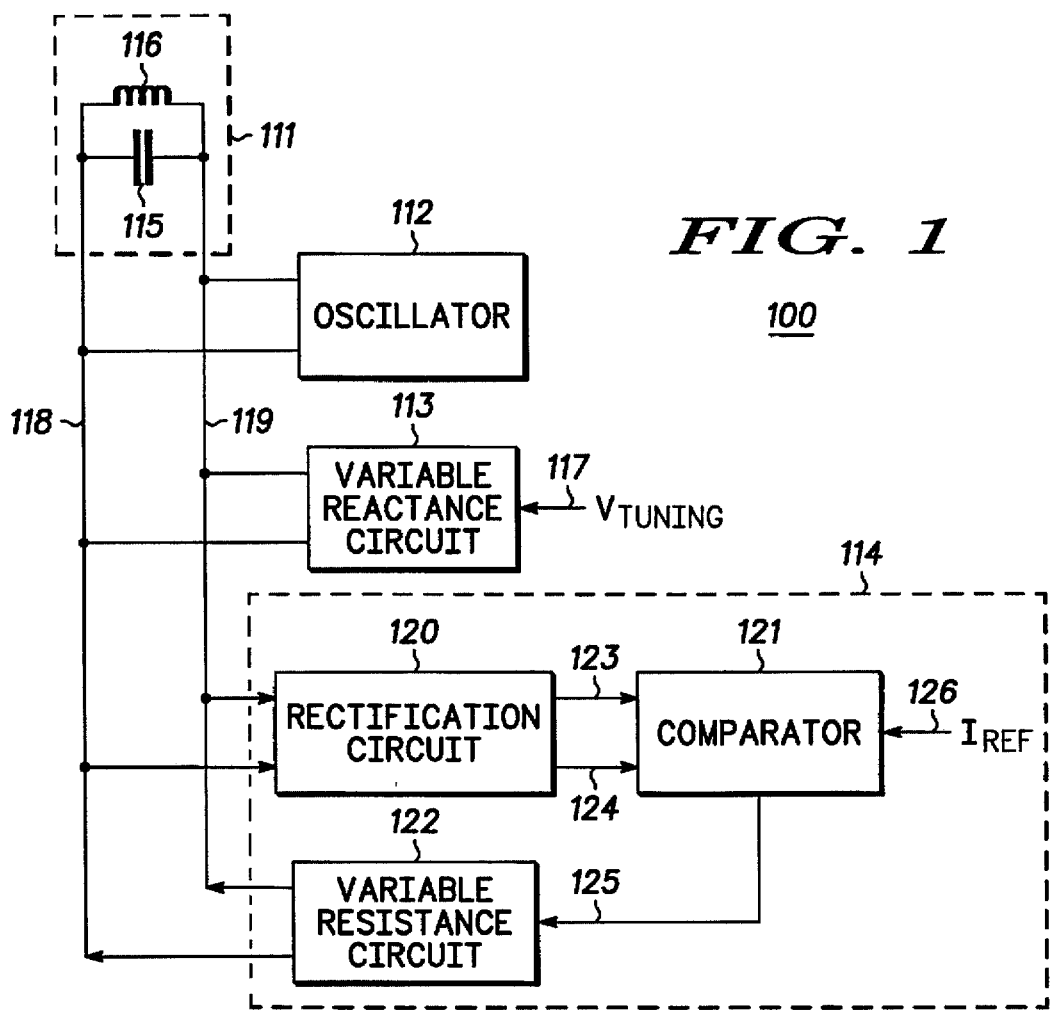
FIG. 1 is a block diagram of a tunable oscillator circuit incorporating an active damping circuit in accordance with the present invention.

FIG. 1 is a block diagram showing the component parts of a frequency tunable oscillator circuit 100 implementing the present invention. Tank circuit 111, comprising an inductor 116 and capacitor 115, establishes a center frequency for oscillator 112 in the absence of a tuning signal from a variable reactance circuit 113. It is coupled to an oscillator 112, the variable reactance circuit 113 and an active damping circuit 114 comprising a rectification circuit 120, a comparator circuit 121 and a variable resistance circuit 122. The oscillator 112 is typically configured as a cross-coupled differential amplifier which supplies differential currents into the tank circuit 111 at a television receiver's intermediate frequency and may be operated at one-half the IF frequency in conjunction with a frequency doubler to provide greater phase stability and to avoid interference with RF signals of the lower VHF television channels.

Tuning is accomplished by a variable reactance circuit 113 which produces a variable effective reactance across the tank circuit 111. When a tuning control voltage, Vtuning, applied at terminal 117 is used to vary the effective reactance, the frequency tunable oscillator circuit 100 is a voltage controlled oscillator 100 (VCO). Because tank circuit 111 has an inherently high Q, currents supplied into it by both the oscillator 112 and variable reactance circuit 113 produce a sine wave voltage at the intermediate frequency between terminals 118 and 119. Variable reactance circuits have used varactor diodes or similar voltage variable capacitance devices. However, it has been found that for broadband tuning applications varactor diodes require too much variation in control voltage to be practical for incorporation on an integrated circuit die with the VCO.

Other variable reactance circuits 113 are known which are more suitable for integration on the same semiconductor die with the oscillator 112. Such circuits are also known as balanced variable reactance circuits 113 or, if the reactance is established by a capacitor, balanced variable capacitance circuits 113. Several such embodiments are described in U.S. Pat. No. 4,638,265, "BALANCED VARIABLE REACTANCE CIRCUIT AND METHOD OF PRODUCING THE SAME," by inventors Gerald K. Lunn, W. Eric Main and Michael McGinn, and assigned to the same assignee, Motorola, Inc., which is incorporated by reference herein. One embodiment uses a balanced variable reactance circuit to supply differential reactance currents into tank circuit 111 corresponding to the magnitude of the tuning control voltage applied at terminal 117. The differential reactance currents produce an effective tuning reactance in parallel with the tank circuit 111 which may be either positive or negative according to whether the differential reactance currents are positive or negative, i.e., whether oscillator 112 is being tuned below or above its center frequency. The resonant frequency of the VCO then varies according to the equation $$f_{res} = \frac{1}{2\pi \sqrt{L(C + C_{tun})}}$$

where C is the capacitor 115. $C_{tun}$ represents the effective tuning reactance from variable reactance circuit 113 which combines with C to vary the tuning frequency of the VCO.

Figure 2:
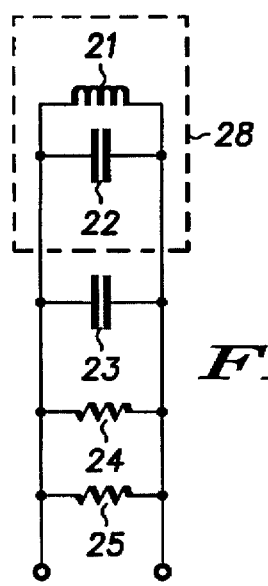
FIG. 2 is a schematic diagram of an equivalent tank network.

FIG. 2 is a detailed schematic of a parallel equivalent tank network showing the main components influencing the Q and resonant frequency of the VCO. Inductor 21 and capacitor 22 are fixed components normally external to the integrated circuit. They form a tank circuit 28 which sets a center frequency of the VCO. In one embodiment of the invention, inductor 21 has a value of 2 millihenries and capacitor 22 has a value of 30 picofarads. Equivalent variable capacitor 23 represents a tuning capacitance provided by a balanced variable reactance circuit. Resistor 24 is a fixed resistor with a value of say 14 kilo-ohms which is incorporated on the integrated circuit die and is used for setting a target Q for the VCO. Equivalent resistor 25 represents parasitic resistance resulting from, among other things, parasitic resistive currents generated in the variable reactance circuit, i.e., currents in phase with the tank voltage rather than leading it by 90 degrees. The effect of equivalent resistor 25 on the Q of the VCO is shown by the equation $$Q = 2\pi f C \frac{R_{24} \cdot R_{25}}{R_{24} + R_{25}}$$

If the parasitic resistive currents supplied by the balanced variable reactance circuit are very small, equivalent resistor 25 is very large compared to resistor 24 and the Q of the VCO depends only on resistor 24. In practice, however, equivalent resistor 25 is closer in magnitude to resistor 24 so that the Q depends on both components. Moreover, equivalent resistor 25 varies with the VCO tuning frequency and may be either positive or negative. Accordingly, the Q of the VCO may be larger or smaller than the ideal value set by resistor 24 as the VCO is tuned across the band.

Figure 3:
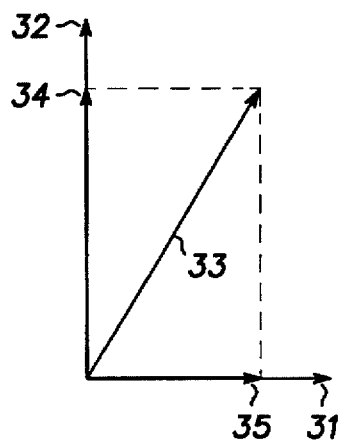
FIG. 3 is a vector diagram illustrating the relative phase relationships of component currents in the tank circuit.

The source of the frequency variation in equivalent resistor 25 is shown in FIG. 3 which is a vector diagram showing the sine wave voltage across the tank circuit 28 (vector 31) in relation to currents in the fixed capacitor 22 (vector 32) and the equivalent variable capacitor 23 (vector 33). Taking the sine wave voltage across the tank circuit (vector 31) as a reference, the current into equivalent capacitor 23 (vector 33) deviates from the ideal 90 degree leading phase relationship seen in fixed capacitor 22 (vector 32) by an amount corresponding to the delay in the variable reactance circuit. Vector 33 is thereby comprised of a capacitive component (vector 34) which retains the ideal quadrature relationship to the vector 31, and a resistive component (vector 35) which is in phase with the tank voltage. Equivalent resistor 25 results from the resistive current associated with vector 35. The time delay through the variable reactance circuit is essentially constant so that the phase of vector 33 varies with the resonant frequency of the oscillator. The variable phase shift causes equivalent resistor 25 to vary in magnitude and to take on either positive or negative values according to whether the variable reactance circuit supplies positive or negative reactance currents into the tank circuit. Both the Q of the tank network and the amplitude of the sine wave voltage across it thereby change with frequency.

Referring back to FIG. 1, an active damping circuit 114 is shown which comprises a rectification circuit 120, a comparator 121 and a variable resistance circuit 122. The rectification circuit 120 senses and rectifies the voltage across the tank circuit at differential inputs coupled to terminals 118 and 119. It produces differential rectified output currents at terminals 123 and 124 which are coupled to differential inputs of a comparator 121. Comparator 121 compares the average difference between the differential rectified currents and a reference current Iref and produces at terminal 125 a correction signal for controlling the Q of the VCO. Iref is coupled to input 126 and is typically generated on the semiconductor die. The correction signal controls a variable resistance circuit 122 which supplies differential resistive currents to the tank circuit 111 at terminals 118 and 119. The differential resistive currents are substantially equal in magnitude and opposite in polarity to the parasitic resistive currents supplied by the variable reactance circuit 113.

It has been observed that the active damping circuit 114 is also capable of counteracting the phase shifting effect on Q of any parasitic series resistance in the inductor 116. As a result, less expensive inductors 116 having higher parasitic series resistances may be used in the tank circuit 111 without diminishing the performance of the VCO.

Figure 4:
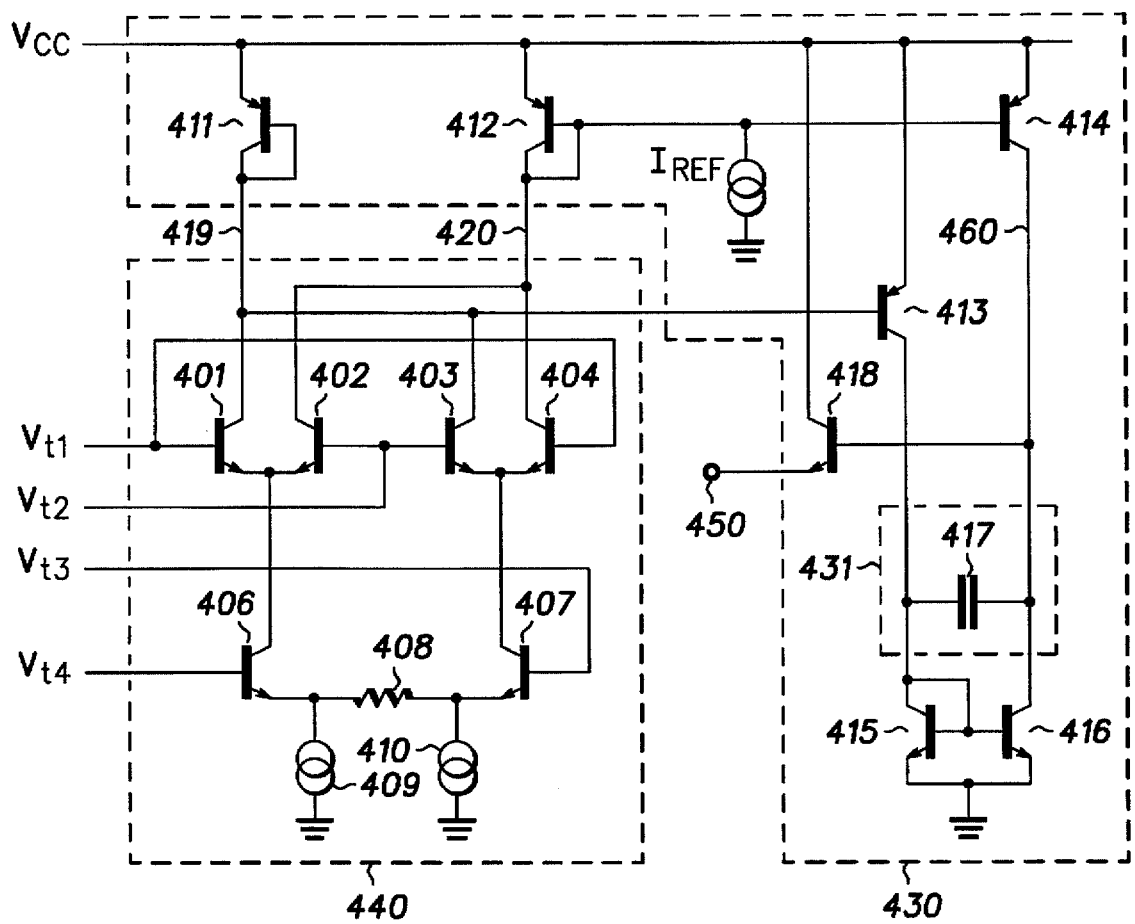
FIG. 4 is a schematic diagram of a rectification circuit and a comparator in accordance with the present invention.

FIG. 4 shows a schematic of a rectification circuit 440 and a comparator circuit 430 for processing a voltage across a tank circuit (not shown) and producing a correction signal or Q control voltage which corresponds to the Q of the tank circuit at terminal 450. Vt1 and Vt2 are signals applied to the rectification circuit 440 whose difference is equal in magnitude to the alternating current (AC) level of the tank circuit voltage but at a different direct current (DC) level. Similarly, Vt3 and Vt4 have the same AC level as the voltage across the tank circuit but a different DC level. The AC voltage levels across the tank circuit are typically 800 millivolts peak to peak. The rectification circuit 440 and comparator circuit 430 are typically connected between two power supply terminals for receiving power supply voltages, e.g., Vcc and ground.

Transistors 401 and 402 comprise a first differential amplifier with their emitters coupled in common. Transistors 403 and 404 form a second differential amplifier with their emitters coupled in common which, along with the first differential amplifier, comprise one part of a doubly balanced multiplier configuration for sensing the tank voltage. This configuration full wave rectifies the tank voltage and supplies differential rectified output currents to the differential inputs to the comparator at terminals 419 and 420. The bases of transistors 401 and 404 are coupled to Vt1 and the bases of transistors 402 and 403 are coupled to Vt2 for switching currents through the respective differential pairs in accordance with the tank voltage. The collectors of transistors 401 and 403 are coupled to terminal 419 and the collectors of transistors 402 and 404 are coupled to terminal 420 for supplying differential rectified currents to the comparator 430.

A second portion of the doubly balanced multiplier is comprised of transistors 406 and 407 and resistor 408 which is coupled between their respective emitters. Vt3 is coupled to the base of transistor 407 and Vt4 is coupled to the base of transistor 406 for steering proportional differential currents to the collectors of transistors 406 and 407 from current sources 409 and 410 respectively. Resistor 408 linearizes the conversion of the difference between voltages Vt3 and Vt4 to the proportional differential currents steered to the collectors of transistors 406 and 407. In one embodiment resistor 408 has a value of 8 kilo-ohms. Current sources 409 and 410 supply bias currents for the rectification circuit.

The differential rectified currents from the rectification circuit are coupled to the comparator 430 at terminals 419 and 420. They are received by transistors 411 and 412 which are configured as diodes and are respectively matched to transistors 413 and 414 so that the collector current of transistor 411 is proportional to that of transistor 413 and the collector current of transistor 412 is proportional to that of transistor 414. Similarly, transistors 415 and 416 are matched for producing proportionate currents in their respective collectors.

The doubly balanced multiplier configuration of the rectification circuit 440 acts as a full wave rectifier so that the differential rectified currents supplied to the comparator have an AC component which is centered at about 90 megahertz, or twice the IF frequency, and a proportional DC component. Transistors 411, 412, 413 and 414 are chosen to have a slow response at that frequency, thereby providing filtering to limit the bandwidth of the differential rectified currents so that the collector currents of transistors 413 and 414 are essentially DC currents. A filter circuit 431 is connected between the collector and base terminals of transistor 416 to provide additional filtering if needed. In the embodiment shown, additional filtering is provided by capacitor 417, whose value is about 3 picofarads.

Iref is coupled to the bases of transistors 412 and 414 and introduces an offset current into the comparator 430. Its purpose is to set a target threshold for the Q control voltage on terminal 450 such that zero correction is provided when the VCO is tuned to its center frequency. At the center frequency, the VCO has nominal Q and AC voltage amplitude. Transistors 413, 414, 415 and 416 comprise a transconductance gain stage which converts the differential rectified currents of the rectification circuit to a voltage on the collector of transistor 416 corresponding to the deviation from the nominal Q. Transistor 418 is operated as an emitter follower to prevent loading of terminal 460. The Q control voltage appears on its emitter at terminal 450.

Figure 5:
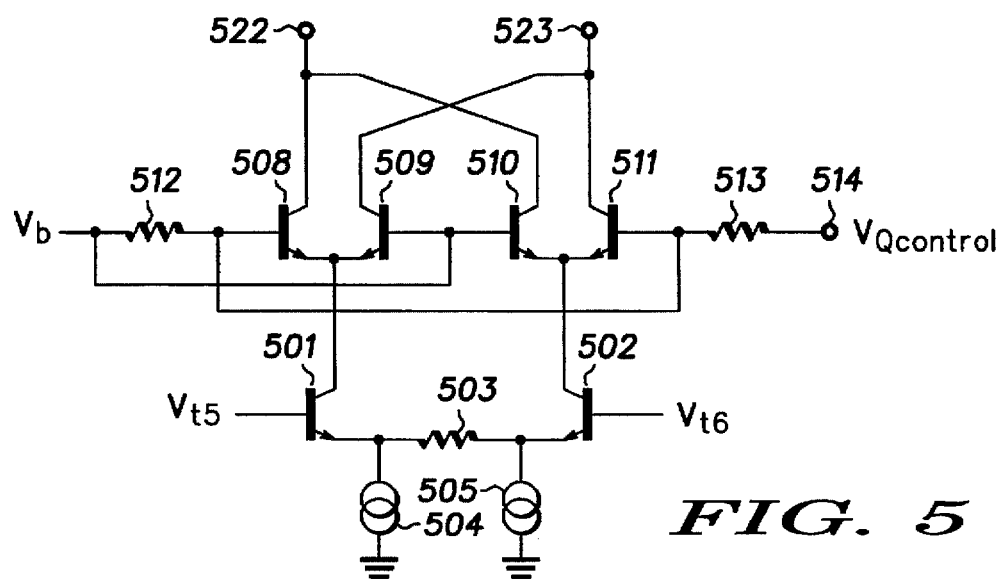
FIG. 5 is a schematic diagram of a variable resistance circuit in accordance with the present invention.

FIG. 5 is a schematic of a variable resistance circuit which supplies differential resistive currents to a tank circuit across terminals 522 and 523 (not shown). The differential resistive currents are proportional to VQcontrol, a Q control voltage from the comparator applied at input 514. The voltage across Vt5 and Vt6 has an AC magnitude equal to the voltage across the tank circuit but at a different DC level for biasing transistors 501 and 502. Voltages Vt5 and Vt6 are derived from the tank circuit voltages by using conventional DC level shifting circuits.

Transistors 501 and 502 together with resistor 503 form a linear transconductance amplifier for steering differential currents from current sources 504 and 505 to their respective collectors. The differential currents are proportional to the voltage across Vt5 and Vt6, which are respectively coupled to the bases of transistors 501 and 502, and the magnitude of resistor 503. In one embodiment the value of resistor 503 is 8 kilo-ohms. Because the voltage across Vt5 and Vt6 is a sine wave voltage of equal AC magnitude and phase with the voltage across the tank circuit, the differential currents steered into the collectors of transistors 501 and 502 also form a sine wave in phase with the tank voltage for counteracting the resistive current from the variable reactance circuit.

The level of counteracting differential current is determined by the doubly balanced pair of differential amplifiers respectively formed by transistors 508 and 509 and transistors 510 and 511. Current is steered through these two differential amplifiers in proportion to the voltages across their respective bases. One such base voltage is Vb, which is a DC reference voltage coupled to the bases of transistors 509 and 510. The other voltage is derived from a voltage divider network between Vb and VQcontrol consisting of resistors 512 and 513. The differential resistive currents from the collectors of transistors 501 and 502 are thereby steered through the doubly balanced differential amplifiers into the tank circuit connected to terminals 522 and 523 in proportion to the Q control voltage at input 514.

The active damping circuit supplies resistive currents into a tank circuit which are equal in magnitude and opposite in phase to parasitic resistive currents from a balanced variable reactance circuit or from series resistance in the tank inductor. It is thereby able to substantially reduce or eliminate variations in Q as the VCO is tuned across the frequency band. In one embodiment of the present invention the nominal Q of the VCO was increased from about 30 to about 75 using the active damping circuit, thereby achieving better noise performance at no loss of stability margins in the variable reactance circuit. Because the active damping circuit is integrated on the same semiconductor die as the VCO, system cost is reduced. Further cost reductions are possible because the active damping circuit compensates for the parasitic resistance of the tank circuit inductor without degrading performance.

By now it should be appreciated that an active damping circuit in accordance with the present invention allows a VCO to be tuned over a wide frequency range while maintaining a constant, high Q for low noise performance without reducing stability margins. Cost is reduced because essentially all circuit components except the tank inductor and capacitor are integrated onto a semiconductor chip. Cost is further reduced because active damping compensates for series inductor resistance, thereby allowing for the use of lower quality, high series resistance inductors in the tank circuit.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

I claim:

1. A frequency tunable oscillator circuit having a differential output for providing an output signal, comprising:
   a tank circuit coupled across the differential output of the frequency tunable oscillator circuit for setting a center frequency;
   a variable reactance circuit coupled across the differential output of the frequency tunable oscillator circuit for varying a frequency of the output signal; and
   an active damping circuit coupled across the differential output of the frequency tunable oscillator circuit to maintain the frequency tunable oscillator circuit at a constant Q.

2. The frequency tunable oscillator circuit of claim 1 wherein the frequency tunable oscillator circuit is a voltage controlled oscillator.

3. The frequency tunable oscillator circuit of claim 1 wherein said variable reactance circuit includes an input for receiving a tuning control voltage.

4. The frequency tunable oscillator circuit of claim 3 wherein said variable reactance circuit is a balanced variable capacitance circuit.

5. The frequency tunable oscillator circuit of claim 4 wherein said tank circuit sets said center frequency of the frequency tunable oscillator circuit at approximately 45 megahertz.

6. The frequency tunable oscillator circuit of claim 5 wherein said variable reactance circuit provides a reactance across the differential output of the frequency tunable oscillator circuit to vary a frequency of the output signal between a range of 34 megahertz to 56 megahertz.

7. The frequency tunable oscillator circuit of claim 1 wherein said active damping circuit comprises:
 a rectification circuit having a differential input coupled to said differential output of said frequency tunable oscillator circuit, and a differential output;
 a comparator circuit having a first differential input coupled to the differential output of the rectification circuit, a second input coupled to a reference current, and an output; and
 a variable resistance circuit having an input coupled to the output of said comparator circuit and a differential output coupled to the differential output of the frequency tunable oscillator circuit.

8. The frequency tunable oscillator circuit of claim 7 wherein the rectification circuit includes a filter circuit for limiting a bandwidth of the rectification circuit, the filter circuit having a first terminal coupled to the output of the rectification circuit and a second terminal coupled to a power supply terminal.

9. A frequency tunable oscillator circuit having a differential output for providing an output signal comprising:
 an active damping circuit for controlling a Q of the frequency tunable oscillator circuit, said active damping circuit comprising
 a rectification circuit having a differential input coupled across the differential output of the frequency tunable oscillator circuit and a differential output for producing first and second rectified currents corresponding to the output signal of the frequency tunable oscillator circuit;
 a comparator circuit having a differential input coupled to said differential output of said rectification circuit, an input for receiving a reference voltage, and an output for providing a Q control signal; and
 a variable resistance circuit having an input coupled to said output of said comparator circuit and a differential output coupled to the differential output of the frequency tunable oscillator circuit, said variable resistance circuit supplying first and second resistance currents to adjust said Q of the frequency tunable oscillator circuit.

10. The frequency tunable oscillator circuit of claim 9 wherein the active damping circuit further comprises:
 a filter circuit coupled between the output of the comparator circuit and a power supply terminal for limiting a bandwidth of the Q control signal.

11. The frequency tunable oscillator circuit of claim 10 wherein the variable resistance circuit includes:
 a first differential amplifier having a common terminal for steering first and second differential currents respectively to the differential output of the variable resistance circuit from the common terminal in response to receiving the Q control signal;
 a second differential amplifier having a common terminal for steering third and fourth differential currents respectively to the differential output of the variable resistance circuit from the common terminal in response to the Q control signal, wherein the first and third differential currents comprise the first resistance current and the second and fourth differential currents comprise the second resistance current of the variable resistance circuit; and
 a current steering circuit having first and second emitters and a resistor coupled between the first and second emitters for respectively steering a first and a second proportional current into the common terminals of the first and second differential amplifiers in response to the output signal of the frequency tunable oscillator circuit.

12. The frequency tunable oscillator circuit of claim 11 wherein the rectification circuit is a full-wave rectifier.

13. The frequency tunable oscillator circuit of claim 12 wherein the rectification circuit includes:
 a first differential amplifier having a differential input coupled to the differential output of the frequency tunable oscillator circuit and a common terminal for steering first and second proportional currents respectively to the differential output of the rectification circuit from the common terminal in response to the output signal of the frequency tunable oscillator circuit;
 a second differential amplifier having a differential input coupled to the differential output of the frequency tunable oscillator circuit and a common terminal for steering third and fourth proportional currents respectively to the differential output of the rectification circuit from the common terminal in response to the output signal of the frequency tunable oscillator circuit, the first and third proportional currents comprising the first rectified current and the second and fourth proportional currents comprising the second rectified current; and
 a current steering circuit having a first and a second emitter and a resistor coupled between the first and second emitters for respectively steering first and second proportional currents to the common terminals of the first and second differential amplifiers of the rectification circuit in response to the output signal of the frequency tunable oscillator circuit.

14. The frequency tunable oscillator circuit of claim 13, further comprising:
 a tank circuit coupled across the differential output of the frequency tunable oscillator circuit for setting a center frequency of the frequency tunable oscillator circuit.

15. The frequency tunable oscillator circuit of claim 14, further comprising:
 a variable reactance circuit for tuning a frequency of the frequency tunable oscillator circuit, the variable reactance circuit having a differential output coupled across the differential output of the frequency tunable oscillator circuit.

16. The frequency tunable oscillator circuit of claim 15 wherein the frequency tunable oscillator circuit is a voltage controlled oscillator.

17. The frequency tunable oscillator circuit of claim 16 wherein said variable reactance circuit includes an input for receiving a tuning control voltage.

18. The frequency tunable oscillator circuit of claim 17 wherein said tank circuit sets said center frequency of the frequency tunable oscillator circuit at approximately 45 megahertz.

19. The frequency tunable oscillator circuit of claim 18 wherein said variable reactance circuit provides a reactance across the differential output of the frequency tunable oscillator circuit to vary the frequency of the output signal between a range of 34 megahertz to 56 megahertz.

20. A method for maintaining a Q of a frequency tunable oscillator circuit substantially constant, comprising the steps of:

providing a reactive load to the frequency tunable oscillator circuit for developing an output signal;

varying a reactance to alter a tuning frequency of the frequency tunable oscillator circuit;

comparing the output signal with a reference signal for controlling a resistive current indicative of the Q at the tuning frequency; and damping the frequency tunable oscillator circuit with the resistive current to maintain the Q substantially constant when the tuning frequency changes.

21. The method of claim 20 wherein the step of comparing comprises the steps of:

sensing a magnitude of the output signal;

rectifying the output signal to generate a rectified output signal corresponding to the magnitude of the output signal; and filtering the rectified output signal for reducing a bandwidth of the rectified output signal.

22. The method of claim 20, wherein the step of providing a reactive load includes a step of developing the output signal with a tank circuit.

23. The method of claim 22, further comprising a step of generating a reference signal to represent the Q of the frequency tunable oscillator circuit at a center frequency of the tank circuit.

24. A frequency tunable oscillator circuit, comprising:

a reactive load coupled to an output of the frequency tunable oscillator circuit for developing an output signal;

a variable reactance circuit coupled to the output of the frequency tunable oscillator circuit for varying a tuning frequency of the output signal; and an active damping circuit coupled to the output of the frequency tunable oscillator circuit to maintain the output signal at a constant Q when the tuning frequency changes.

25. The frequency tunable oscillator circuit of claim 24, wherein the reactive load comprises a tank circuit.

26. The frequency tunable oscillator circuit of claim 25, wherein the active damping circuit comprises:

a rectification circuit having an input coupled to the output of the frequency tunable oscillator circuit;

a comparator having a first input coupled to an output of the rectification circuit and a second input coupled for receiving a reference signal; and a variable resistance circuit having an input coupled to an output of the comparator circuit and an output coupled to the output of the frequency tunable oscillator circuit.

* * * * *